US012666828B2

(12) United States Patent
Wang et al.

(10) Patent No.: US 12,666,828 B2
(45) Date of Patent: Jun. 23, 2026

(54) DISPLAY PANEL WITH CONDUCTIVE BLOCKS AND REPAIRING METHOD THEREFOR, AND DISPLAY APPARATUS

(71) Applicants:HEFEI XINSHENG OPTOELECTRONICS TECHNOLOGY CO., LTD., Hefei (CN); BOE TECHNOLOGY GROUP CO., LTD., Beijing (CN)

(72) Inventors: Haitao Wang, Beijing (CN); Jun Wang, Beijing (CN); Jun Cheng, Beijing (CN)

(73) Assignees: HEFEI XINSHENG OPTOELECTRONICS TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 485 days.

(21) Appl. No.: 18/254,183

(22) PCT Filed: Jun. 10, 2022

(86) PCT No.: PCT/CN2022/098244
§ 371 (c)(1),
(2) Date: May 24, 2023

(87) PCT Pub. No.: WO2023/236210
PCT Pub. Date: Dec. 14, 2023

(65) Prior Publication Data
US 2024/0357879 A1 Oct. 24, 2024

(51) Int. Cl.
H10K 59/131 (2023.01)
H10K 59/12 (2023.01)
*G09G 3/3258* (2016.01)

(52) U.S. Cl.
CPC ....... *H10K 59/131* (2023.02); *H10K 59/1201* (2023.02); *G09G 3/3258* (2013.01);
(Continued)

(58) Field of Classification Search
CPC ............. H10K 59/131; H10K 59/1201; G09G 3/3258; G09G 2300/0426; G09G 2300/0842; G09G 2310/08; G09G 2330/08
See application file for complete search history.

(56) References Cited

U.S. PATENT DOCUMENTS

| | | | | |
|---|---|---|---|---|
| 2004/0188681 | A1* | 9/2004 | Lai .................... | G02F 1/136259 257/59 |
| 2005/0275038 | A1* | 12/2005 | Shih ................... | H10D 30/6755 257/382 |

(Continued)

FOREIGN PATENT DOCUMENTS

| | | |
|---|---|---|
| CN | 103700320 A | 4/2014 |
| CN | 112614871 A | 4/2021 |

(Continued)

*Primary Examiner* — Lex H Malsawma
(74) *Attorney, Agent, or Firm* — Dority & Manning, P.A.

(57) ABSTRACT

A display panel includes a substrate, at least one scan signal line and at least one first conductive block. The scan signal line is disposed on the substrate; a scan signal line in the at least one scan signal line includes a wire body and at least one transfer pad, and a transfer pad in the at least one transfer pad is disposed at an end of the wire body. A first conductive block in the at least one first conductive block is located in a different layer from the scan signal line and electrically insulated from the scan signal line; an orthographic projection of the first conductive block on the substrate at least partially overlaps with an orthographic projection of the transfer pad on the substrate.

20 Claims, 7 Drawing Sheets

(52) U.S. Cl.

CPC .............. *G09G 2300/0426* (2013.01); *G09G 2300/0842* (2013.01); *G09G 2310/08* (2013.01); *G09G 2330/08* (2013.01)

(56) References Cited

U.S. PATENT DOCUMENTS

| | | | | |
|---|---|---|---|---|
| 2008/0158465 A1 | | 7/2008 | Choi et al. | |
| 2015/0028341 A1* | | 1/2015 | Sun .................... | H10D 86/451 |
| | | | | 438/151 |
| 2015/0379923 A1* | | 12/2015 | Lee .................. | H10K 59/1315 |
| | | | | 345/82 |
| 2017/0269444 A1 | | 9/2017 | Hao et al. | |
| 2019/0067409 A1 | | 2/2019 | Shin et al. | |
| 2020/0350309 A1 | | 11/2020 | Long | |
| 2020/0356205 A1* | | 11/2020 | Sun .................... | G06F 3/04164 |
| 2020/0411455 A1 | | 12/2020 | He | |
| 2021/0327904 A1 | | 10/2021 | Li et al. | |
| 2021/0335679 A1 | | 10/2021 | Luo | |
| 2022/0085133 A1* | | 3/2022 | Yuan ................ | H10K 59/1216 |

FOREIGN PATENT DOCUMENTS

| | | |
|---|---|---|
| CN | 114446260 A | 5/2022 |
| JP | H1152418 A | 2/1999 |

* cited by examiner

1000

100

200

DISPLAY PANEL WITH CONDUCTIVE BLOCKS AND REPAIRING METHOD THEREFOR, AND DISPLAY APPARATUS

CROSS-REFERENCE TO RELATED APPLICATION

This application is a national phase entry under 35 USC 371 of International Patent Application No. PCT/CN2022/098244, filed on Jun. 10, 2022, which is incorporated herein by reference in its entirety.

TECHNICAL FIELD

The present disclosure relates to the field of display technologies, and in particular, to a display panel and a repairing method therefor, and a display apparatus.

BACKGROUND

With the rapid development of display technologies, display apparatuses have gradually come throughout people's lives. Organic light-emitting diodes (OLEDs) are widely used in smart products such as mobile phones, televisions, and notebook computers due to their advantages of self-luminescence, low power consumption, wide viewing angle, fast response speed, high contrast, and flexible display.

SUMMARY

In an aspect, a display panel is provided. The display panel includes a substrate, at least one scan signal line and at least one first conductive block. The scan signal line is disposed on the substrate; a scan signal line in the at least one scan signal line includes a wire body and at least one transfer pad, and a transfer pad in the at least one transfer pad is disposed at an end of the wire body. A first conductive block in the at least one first conductive block is located in a different layer from the scan signal line and electrically insulated from the scan signal line; an orthographic projection of the first conductive block on the substrate at least partially overlaps with an orthographic projection of the transfer pad on the substrate.

In some embodiments, the wire body extends along a first direction, and in a second direction, a dimension of the transfer pad is greater than a width of the wire body; the second direction is substantially perpendicular to the first direction.

In some embodiments, the display panel further includes a pixel circuit and at least one second conductive block. The pixel circuit is disposed on the substrate. The pixel circuit includes a plurality of transistors, and each transistor includes a gate. A second conductive block in the at least one second conductive block is located in a different layer from the gate of the transistor and electrically insulated from the gate of the transistor; an orthographic projection of the second conductive block on the substrate at least partially overlaps with an orthographic projection, on the substrate, of a gate of at least one transistor in the pixel circuit.

In some embodiments, a switching transistor is included in the plurality of transistors, and the orthographic projection of the second conductive block on the substrate at least partially overlaps with an orthographic projection of a gate of the switching transistor on the substrate.

In some embodiments, a sensing transistor is included in the plurality of transistors, and the orthographic projection of the second conductive block on the substrate at least partially overlaps with an orthographic projection of a gate of the sensing transistor on the substrate.

In some embodiments, the gate of the at least one transistor and the scan signal line are arranged as a whole.

In some embodiments, the display panel has a display area and a peripheral area disposed at at least one side of the display area, the at least one scan signal line is located in the display area. The display panel further includes a scan driving circuit, at least one gate signal line and at least one third conductive block. The driving circuit is disposed on the substrate and located in the peripheral area. The at least one gate signal line is disposed in a same layer as the scan signal line and located in the peripheral area, the at least one gate signal line extends along a second direction and is electrically connected to the scan driving circuit, and the second direction is substantially perpendicular to an extending direction of the scan signal line. A third conductive block in the at least one third conductive block is disposed in the same layer as the scan signal line and located between the at least one gate signal line and the scan signal line.

In some embodiments, the display panel further includes at least one fourth conductive block that is located in a different layer from the at least one third conductive block and electrically insulated from the at least one third conductive block. An orthographic projection of a fourth conductive block in the at least one fourth conductive block on the substrate at least partially overlaps with an orthographic projection of the third conductive block on the substrate.

In some embodiments, the at least one scan signal line includes a plurality of scan signal lines, and the at least one third conductive block includes a plurality of third conductive blocks; one third conductive block in the plurality of third conductive blocks is disposed between each of the plurality of scan signal lines and the at least one gate signal line. The display panel further includes a plurality of pixel circuits that are arranged in a plurality of rows and a plurality of columns, and pixel circuits in each row are electrically connected to scan signal lines in the plurality of scan signal lines. Scan signal lines, electrically connected to pixel circuits in a same row, in the plurality of scan signal lines constitute a group of scan signal lines, and third conductive blocks, located between the group of scan signal lines and the at least one gate signal line, in the plurality of third conductive blocks constitute a group of third conductive blocks. Orthographic projections of the group of third conductive blocks on the substrate each at least partially overlap with an orthographic projection of a same fourth conductive block in the at least one fourth conductive block on the substrate.

In some embodiments, the display panel further includes one or more transfer lines, an end of a transfer line is electrically connected to the transfer pad of the scan signal line, and another end of the transfer line is electrically connected to the scan driving circuit; the transfer line and the scan signal line are located in different layers, and an orthographic projection of the transfer line on the substrate partially overlaps with an orthographic projection of one or more gate signal lines in the at least one gate signal line on the substrate. In the one or more gate signal lines that partially overlap with the orthographic projection the transfer line on the substrate, a gate signal line is provided with at least one hollow-out region therein, an orthographic projection of each hollow-out region on the substrate partially overlaps with an orthographic projection of at least one transfer line in the one or more transfer lines on the substrate; and in the second direction, a length of the hollow-out region is greater than a width of the transfer line.

In some embodiments, a gate signal line that is at a side of the display area in the first direction and closest to the display area is a set gate signal line; an orthographic projection of the set gate signal line on the substrate partially overlaps with the orthographic projection of the transfer line on the substrate, and the at least one hollowed-out region is disposed in the set gate signal line.

In some embodiments, the at least one gate signal line includes a gate initialization signal line, at least one clock signal line, a first gate voltage signal line and a second gate voltage signal line. The first gate voltage signal line, the second gate voltage signal line, the at least one clock signal line and the gate initialization signal line are sequentially arranged in a direction directed from the display area to the peripheral area, and the set gate signal line is the first gate voltage signal line.

In some embodiments, the at least one scan signal line includes a plurality of scan signal lines, and the one or more transfer lines includes a plurality of transfer lines; the display panel further includes a plurality of pixel circuits that are arranged in a plurality of rows and a plurality of columns, and pixel circuits in each row are electrically connected to scan signal lines in the plurality of scan signal lines. Scan signal lines, electrically connected to pixel circuits in a same row, in the plurality of scan signal lines constitute a group of scan signal lines, and transfer lines, electrically connected to the group of scan signal lines, in the plurality of transfer lines constitute a group of transfer lines; orthographic projections of the group of transfer lines on the substrate each partially overlap with an orthographic projection of a same hollow-out region on the substrate.

In some embodiments, the hollow-out region is substantially in a long strip shape.

In some embodiments, the at least one scan signal line includes a plurality of scan signal lines, and the one or more transfer lines includes a plurality of transfer lines; the display panel further includes a plurality of pixel circuits that are arranged in a plurality of rows and a plurality of columns, and pixel circuits in each row are electrically connected to at least one scan signal line in the plurality of scan signal lines. In the one or more gate signal lines that partially overlap with the orthographic projection of the transfer line on the substrate, at least one gate signal line includes first wire segments and second wire segments that are alternately connected; a first wire segment in the first wire segments is disposed at a side of a row of pixel circuits in the first direction; the first wire segment includes a plurality of wire sub-segments arranged in parallel, and two ends of each wire sub-segment are connected to adjacent second wire segments in the second wire segments, respectively. Orthographic projections, on the substrate, of the plurality of wire sub-segments of the first wire segment each partially overlap with the orthographic projection of at least one transfer line in the plurality of transfer lines on the substrate.

In some embodiments, the orthographic projection of the transfer line on the substrate and an orthographic projection of the third conductive block on the substrate are staggered.

In some embodiments, the at least one scan signal line includes a plurality of scan signal lines; the display panel further includes a plurality of pixel circuits that are arranged in a plurality of rows and a plurality of columns, and pixel circuits in each row are electrically connected to scan signal lines in the plurality of scan signal lines. Scan signal lines, electrically connected to pixel circuits in a same row, in the plurality of scan signal lines constitute a group of scan signal lines, and orthographic projections, on the substrate, of transfer pads in the group of scan signal lines each at least partially overlap with an orthographic projection of a same first conductive block on the substrate.

In some embodiments, the display panel further includes a pixel circuit and at least one second conductive block, the pixel circuit includes a plurality of transistors, and each transistor includes a gate; a second conductive block in the at least one second conductive block is located in a different layer from the gate of the transistor and electrically insulated from the gate of the transistor; an orthographic projection of the second conductive block on the substrate at least partially overlaps with an orthographic projection, on the substrate, of a gate of at least one transistor in the pixel circuit; and the first conductive block, the second conductive block and the fourth conductive block are made of a same material and are disposed in a same layer.

In some embodiments, the display panel includes: a light-shielding layer, a first insulating layer, a semiconductor layer, a gate insulating layer, a gate conductive layer, an interlayer insulating layer and a source-drain conductive layer that are sequentially arranged in a thickness direction of the substrate and away from the substrate. The first conductive block, the second conductive block and the fourth conductive block are located in the light-shielding layer.

In some embodiments, a driving transistor is included in the plurality of transistors. The light-shielding layer further includes at least one light-shielding block, an orthographic projection of a light-shielding block in the at least one light-shielding block on the substrate at least partially overlaps with an orthographic projection of a channel region of the driving transistor on the substrate.

In some embodiments, the at least one scan signal line, the at least one third conductive block and the at least one gate signal line are located in the gate conductive layer.

In some embodiments, there are two scan driving circuits. The two scan driving circuits are disposed at two opposite sides of the display area in a first direction, respectively; the at least one first conductive block includes first conductive blocks, the at least one second conductive block includes second conductive blocks, the at least one third conductive block includes third conductive blocks, and the at least one fourth conductive block includes fourth conductive blocks; the first conductive blocks are symmetrically arranged with respect to a center line of the display area in a second direction; the second conductive blocks are symmetrically arranged with respect to the center line of the display area in the second direction; the third conductive blocks are symmetrically arranged with respect to the center line of the display area in the second direction; the fourth conductive blocks are symmetrically arranged with respect to the center line of the display area in the second direction; and the second direction is substantially perpendicular to the first direction.

In another aspect, a display apparatus is provided. The display apparatus includes the display panel as described in any one of the embodiments above.

In yet another aspect, a repairing method for a display panel is provided. The display panel includes: at least one scan signal line, a scan driving circuit, at least one gate signal line and at least one transfer line, a gate signal line in the at least one gate signal line is electrically connected to the scan driving circuit, an end of a transfer line in the at least one transfer line is electrically connected to a scan signal line in the at least one scan signal line, and another end of the transfer line is electrically connected to the scan driving circuit.

The scan signal line and the gate signal line are disposed in a same layer, the transfer line and the scan signal line are located in different layers; an orthographic projection of the transfer line on the substrate partially overlaps with an orthographic projection of the gate signal line on the substrate; the gate signal line includes first wire segments and second wire segments that are alternately connected; a first wire segment in the first wire segments is disposed at a side of a row of pixel circuits in a first direction; the first wire segment includes a plurality of wire sub-segments arranged in parallel, and two ends of each wire sub-segment are connected to two adjacent second wire segments in the second wire segments, respectively; orthographic projections, on the substrate, of the plurality of wire sub-segments of the first wire segment each partially overlap with the orthographic projection of the transfer line on the substrate.

The repairing method includes: determining a target wire sub-segment when the transfer line and the gate signal line are short-circuited, the target wire sub-segment being a wire sub-segment that is short-circuited with the transfer line in the plurality of wire sub-segments of the first wire segment in the gate signal line; and cutting two ends of the target wire sub-segments, so that the two ends of the target wire sub-segment are disconnected from the two adjacent second wire segments.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these accompanying drawings. In addition, the accompanying drawings to be described below may be regarded as schematic diagrams, and are not limitations on actual sizes of products, actual processes of methods and actual timings of signals involved in the embodiments of the present disclosure.

DETAILED DESCRIPTION

Figure 1:
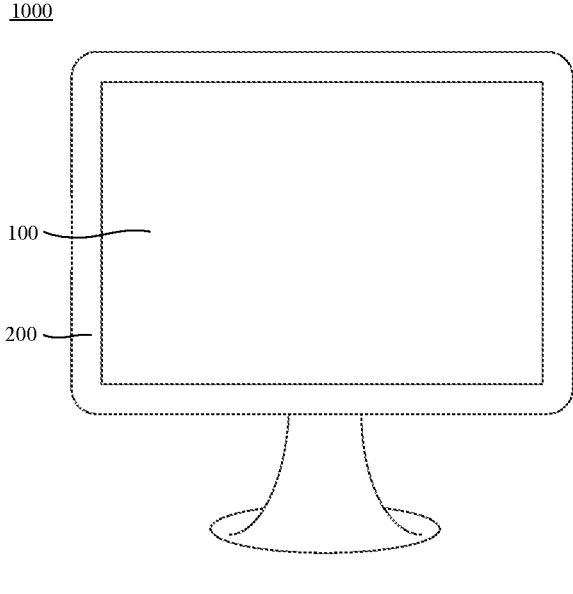
FIG. 1 is a structural diagram of a display apparatus, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the terms "a plurality of", "the plurality of" and "multiple" each mean two or more unless otherwise specified.

In the description of some embodiments, terms such as "coupled" and "connected" and derivatives thereof may be used. For example, the term "connected" may be used in the description of some embodiments to indicate that two or more components are in direct physical or electrical contact with each other. The embodiments disclosed herein are not necessarily limited to the context herein.

The phrase "at least one of A, B and C" has the same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

The phrase "applicable to" or "configured to" used herein means an open and inclusive expression, which does not exclude devices that are applicable to or configured to perform additional tasks or steps.

In addition, the phase "based on" used is meant to be open and inclusive, since a process, step, calculation or other action that is "based on" one or more of the stated conditions or values may, in practice, be based on additional conditions or value exceeding those stated.

As used herein, terms such as "about", "substantially", or "approximately" include a stated value and an average value within an acceptable range of deviation of a particular value. The acceptable range of deviation is determined by a person of ordinary skill in the art in view of the measurement in question and errors associated with the measurement of a particular quantity (i.e., the limitations of the measurement system).

As used herein, the term such as "parallel", "perpendicular", or "equal" includes a stated condition and a condition similar to the stated condition. A range of the similar condition is within an acceptable range of deviation, and the acceptable range of deviation is determined by a person of ordinary skill in the art in view of the measurement in question and errors associated with measurement of a particular quantity (i.e., the limitations of the measurement system). For example, the term "parallel" includes absolute parallelism and approximate parallelism, and an acceptable range of deviation of the approximate parallelism may be, for example, a deviation within 5°. The term "perpendicular" includes absolute perpendicularity and approximate perpendicularity, and an acceptable range of deviation of the approximate perpendicularity may also be, for example, a deviation within 5°. The term "equal" includes absolute equality and approximate equality, and an acceptable range of deviation of approximate equality may be, for example, that a difference between two equals is less than or equal to 5% of any one of the two equals.

It will be understood that, in a case where a layer or component is referred to as being on another layer or a substrate, it may be that the layer or component is directly on the another layer or substrate; or it may be that intermediate layer(s) exist between the layer or component and the another layer or substrate.

Exemplary embodiments are described herein with reference to sectional views and/or plan views as idealized exemplary drawings. In the drawings, thicknesses of layers and sizes of regions are enlarged for clarity. Variations in shape relative to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown to have a rectangular shape generally has a feature of being curved. Therefore, the regions shown in the accompanying drawings are schematic in nature, and their shapes are not intended to show actual shapes of regions in an apparatus, and are not intended to limit the scope of the exemplary embodiments.

In some embodiments, a control electrode of each transistor is a gate of the transistor, a first electrode of the transistor is one of a source and a drain of the transistor, and a second electrode of the transistor is the other one of the source and the drain of the transistor. Since the source and the drain of the transistor may be symmetrical in structure, the source and the drain thereof may be indistinguishable in structure. That is, the first electrode and the second electrode of the transistor in the embodiments of the present disclosure may be indistinguishable in structure. For example, in a case where the transistor is a P-type transistor, the first electrode of the transistor is the source, and the second electrode of the transistor is the drain. For example, in a case where the transistor is an N-type transistor, the first electrode of the transistor is the drain, and the second electrode of the transistor is the source.

The "same layer" mentioned herein refers to a layer structure that is formed by forming a film layer for forming specific patterns by using a same film forming process, and then performing a single patterning process by using a same mask. Depending on different specific patterns, the single patterning process may include multiple exposure, development or etching processes, and the specific patterns in the formed layer structure may be continuous or discontinuous, and these specific patterns may also be at different heights or have different thicknesses.

As shown in FIG. 1, some embodiments of the present disclosure provide a display apparatus 1000. The display apparatus 1000 may be any apparatus that displays images whether in motion (e.g., videos) or stationary (e.g., still images), and whether textual or graphical. For example, the display apparatus 1000 may be any product or component having a display function, such as a television, a notebook computer, a tablet computer, a mobile phone, a personal digital assistant (PDA), a navigator, a wearable device, a virtual reality (VR) device.

In some embodiments, referring to FIG. 1, the display apparatus 1000 includes a display panel 100.

For example, as shown in FIG. 1, the display apparatus 1000 may further include a housing 200, a circuit board (not shown in FIG. 1), and other electronic components. The display panel 100 and the circuit board may be disposed inside the housing 200.

The display panel 100 may be of various types, which may be determined according to actual needs.

For example, the display panel 100 may be an organic light-emitting diode (OLED) display panel, a quantum dot light-emitting diode (QLED) display panel, or a micro light-emitting diode (Micro LED) display panel, which is not specifically limited in the embodiments of the present disclosure.

Some embodiments of the present disclosure will be schematically described below by taking an example in which the display panel 100 is the OLED display panel.

Figure 2:
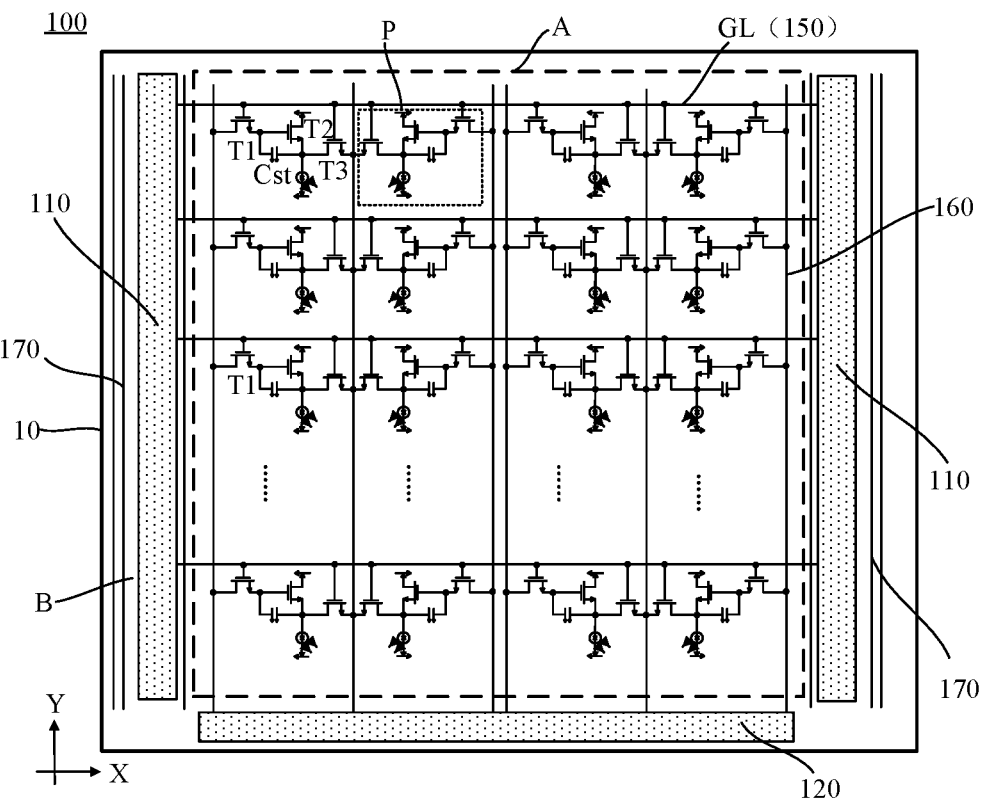
FIG. 2 is a structural diagram of a display panel, in accordance with some embodiments.
Figure 3:
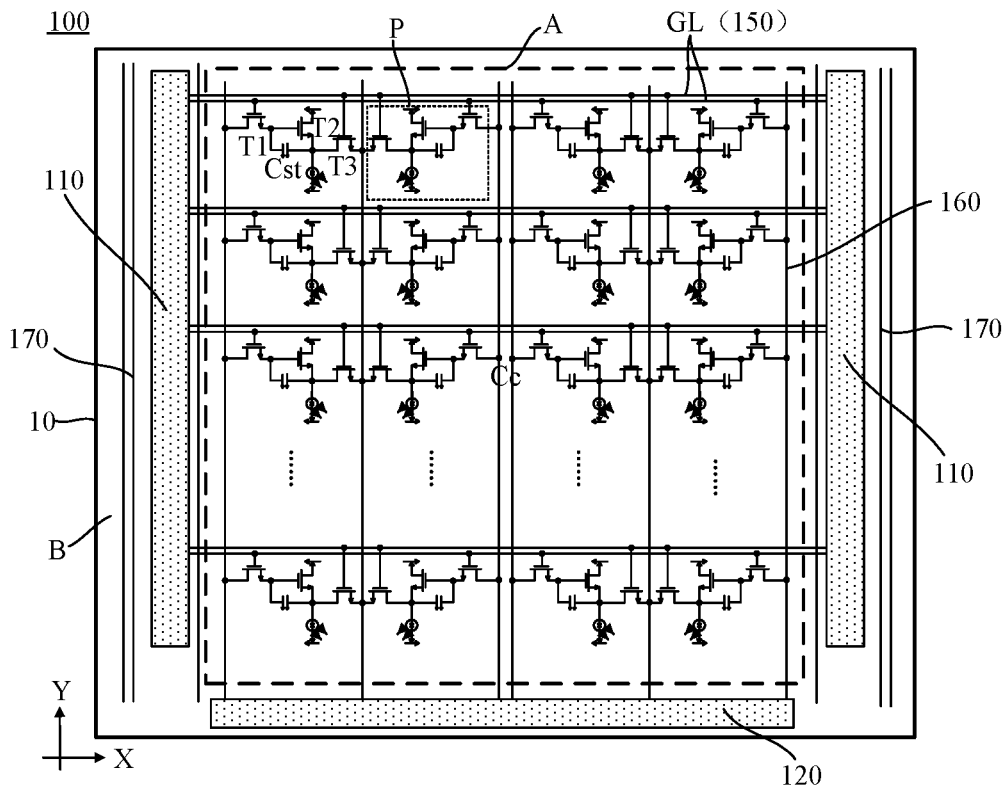
FIG. 3 is a structural diagram of another display panel, in accordance with some embodiments.

In some embodiments, as shown in FIGS. 2 and 3, the display panel 100 has a display area A and a peripheral area B disposed at at least one side of the display area A. FIGS. 2 and 3 illustrate an example in which the peripheral area B is around the display areas A.

As shown in FIGS. 2 and 3, the display area A is an area where an image is displayed, and is configured to be provided with a plurality of sub-pixels P therein. The peripheral area B is an area where no image is displayed, and is configured to be provided with display driving circuits (such as scan driving circuit(s) 110 and a source driving circuit 120) and circuit wires (e.g., gate signal line(s) 170) therein.

In some embodiments, as shown in FIGS. 2 and 3, the display panel 100 may include a substrate 10, the scan driving circuit(s) 110 and at least one gate signal line 170.

Referring to FIGS. 2 and 3, the scan driving circuit(s) 110 and the gate signal line(s) 170 are disposed on the substrate 10; a gate signal line 170 is electrically connected to a scan driving circuit 110, and the gate signal line 170 is configured to provide a control signal to the scan driving circuit 110. The control signal includes at least one of a first gate voltage signal VGL, a second control signal VGH, an initialization signal STV and a clock signal.

A type of substrate 10 may vary, which is determined according to actual needs.

For example, the substrate 10 may be a rigid substrate. For example, the rigid substrate may be a glass substrate or a polymethyl methacrylate (PMMA) substrate.

For example, the substrate 10 may be a flexible substrate. For example, the flexible substrate may be a polyethylene terephthalate (PET) substrate, a polyethylene naphthalate two formic acid glycol ester (PEN) substrate or a polyimide (PI) substrate.

In some embodiments, as shown in FIGS. 2 and 3, the display panel 100 may further include the plurality of sub-pixels P. The plurality of sub-pixels P are disposed on a same side of the substrate 10 as the scan driving circuit 110 and located in the display area A. Components included in the sub-pixel P may refer to FIGS. 4 and 5.

Figure 4:
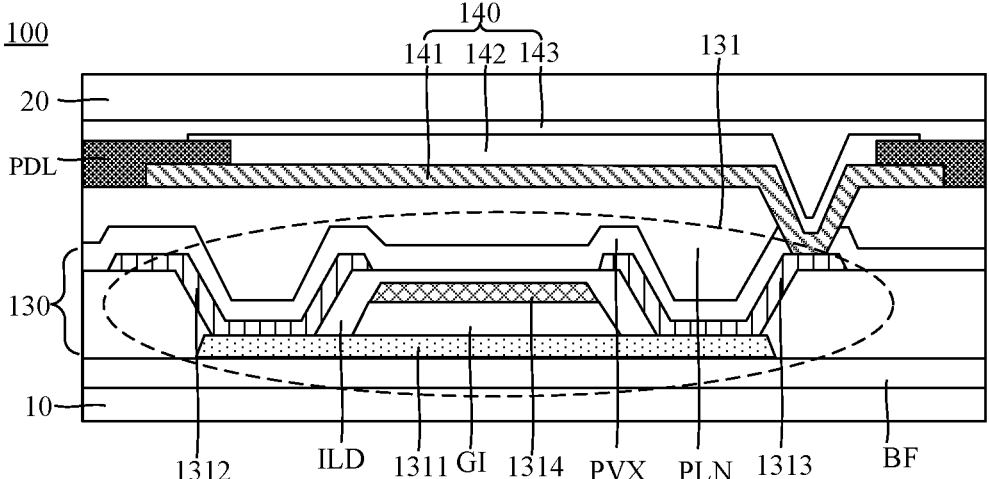
FIG. 4 is a sectional view of a display panel, in accordance with some embodiments.
Figure 5:
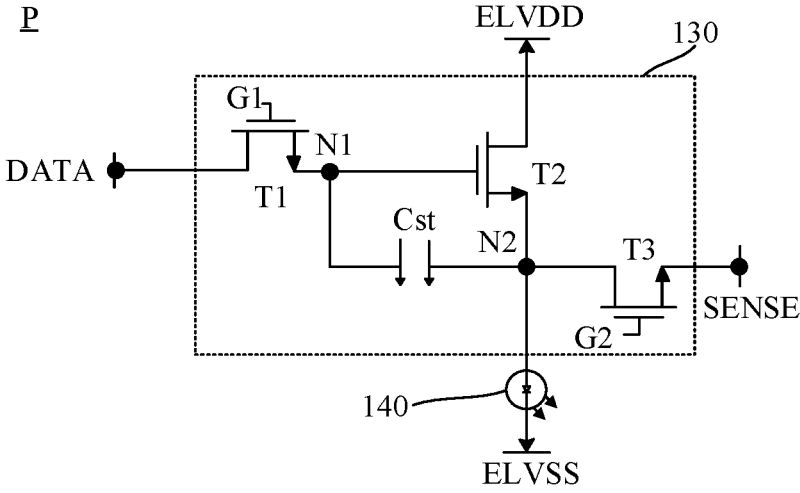
FIG. 5 is a circuit diagram of a sub-pixel, in accordance with some embodiments.

Referring to FIGS. 4 and 5, each sub-pixel P may include a pixel circuit 130 and a light-emitting device 140 electrically connected to the pixel circuit 130. The pixel circuit 130 and the light-emitting device 140 are disposed on the substrate 10.

As shown in FIGS. 4 and 5, the pixel circuit 130 includes a plurality of transistors 131. The transistor 131 includes an active layer 1311, a source 1312, a drain 1313 and a gate 1314. The source 1312 and the drain 1313 are in contact with the active layer 1311.

As shown in FIGS. 4 and 5, the light-emitting device 140 includes a first electrode layer 141, a light-emitting functional layer 142 and a second electrode layer 143. The first electrode layer 141 is electrically connected to a source 1312 or a drain 1313 of a transistor 131 that serves as a driving transistor in the plurality of transistors 131. FIG. 4 illustrates an example in which the first electrode layer 141 is electrically connected to the drain 1313 of the transistor 131.

It will be noted that the source 1212 and the drain 1213 may be interchanged. That is, the marked number 1312 in FIG. 4 represents the drain, and the marked number 1313 in FIG. 4 represents the source.

Referring to FIGS. 2 and 3, the plurality of sub-pixels P may be arranged in a plurality of rows and a plurality of columns, each row includes sub-pixels P arranged along a first direction X, and each column includes sub-pixels P arranged along a second direction Y. The first direction X is substantially perpendicular to the second direction Y.

Based on this, as shown in FIGS. 2 and 3, the display panel 100 may further include: at least one scan signal line 150 substantially extending along the first direction X, and at least one data line 160 substantially extending along the second direction Y. A scan signal line 150 is electrically connected to the scan driving circuit 110, and a data line 160 is electrically connected to the source driving circuit 120.

In this case, as shown in FIGS. 2, 3 and 5, pixel circuits 130 of sub-pixels P in a same row may be electrically connected to a scan signal line 150 substantially extending along the first direction X, and pixel circuits 130 of sub-pixels P in a same column may be electrically connected to a data line 160.

Figure 7:
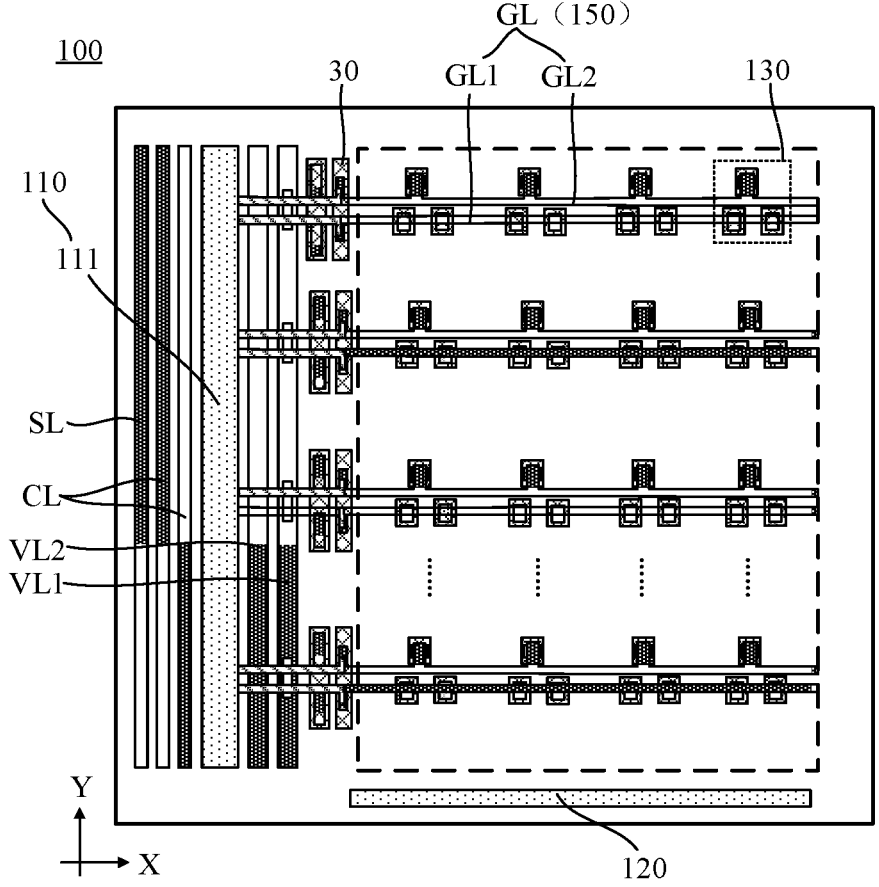
FIG. 7 is a structural diagram of yet another display panel, in accordance with some embodiments.
Figure 8:
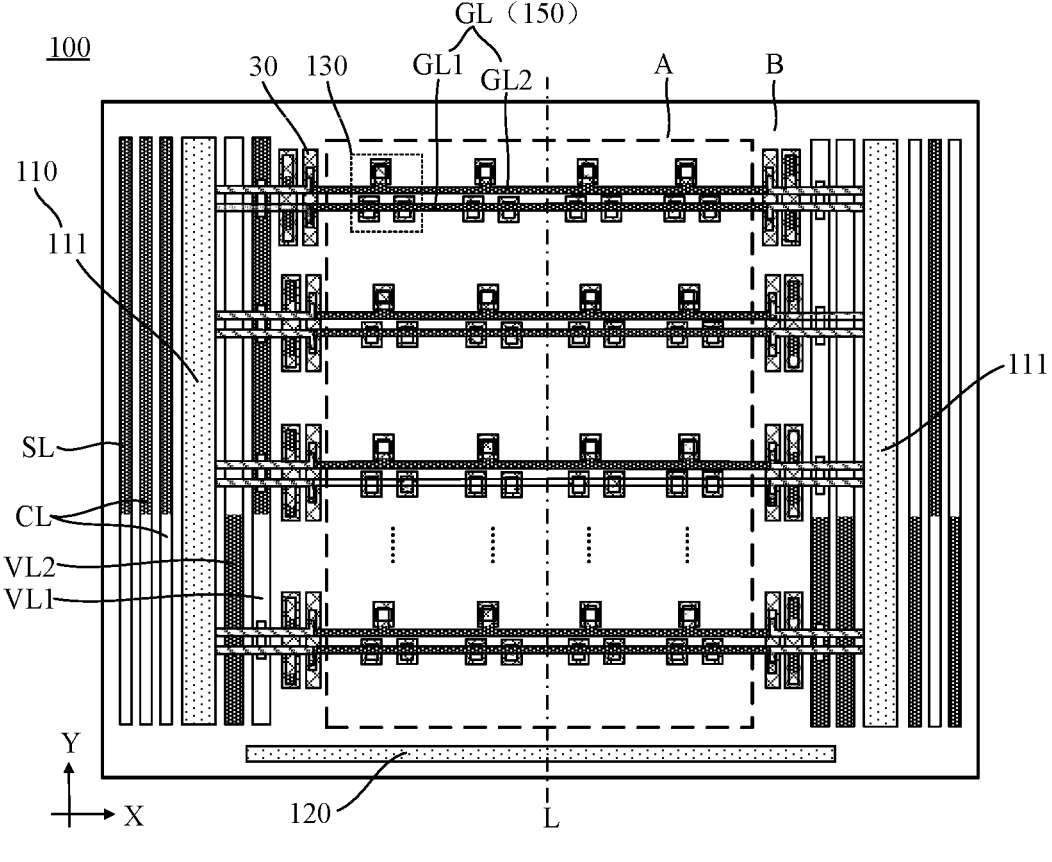
FIG. 8 is a structural diagram of yet another display panel, in accordance with some embodiments.

In some embodiments, referring to FIGS. 7 and 8, the scan driving circuit(s) 110 include only gate driving circuit(s) 111; the scan signal line(s) 150 include only gate scan signal line(s) GL, and a gate scan signal line GL is configured to transmit a scan signal Gate and/or a reset signal Reset.

In some other embodiments, the scan driving circuit(s) 110 include a gate driving circuit 111 and a light-emitting driving circuit. In this case, the scan signal line(s) 150 include enable signal line(s) and gate scan signal line(s) GL, and an enable signal line is configured to transmit an enable signal Em.

It will be understood that, a structure of the pixel circuit 130 varies, which may be set according to actual needs. For example, the structure of the pixel circuit 130 may include a structure of "2T1C", "3T1C", "6T1C", "7T1C", "6T2C", "7T2C", etc. Here, "T" represents a transistor, a number before "T" represents the number of transistors, "C" represents a storage capacitor, and a number before "C" represents the number of storage capacitors.

In addition, during the use of the display panel 100, stabilities of the transistor in the pixel circuit 130 and the light-emitting device 140 may decrease (for example, a threshold voltage of the driving transistor drifts), which affects a display effect of the display panel 100. Thus, the sub-pixel P needs to be compensated.

There are various manners to compensate for the sub-pixel P, which may be set according to actual needs. For example, a pixel compensation circuit may be provided in the sub-pixel P, so that the pixel compensation circuit may be used to perform internal compensation for the sub-pixel P. As another example, the driving transistor or the light-emitting device may be sensed by a transistor in the sub-pixel P, and sensed data is transmitted to an external sensing circuit, so that the external sensing circuit is used to calculate a driving voltage value that needs to be compensated and give feedback. As a result, external compensation for the sub-pixel P is achieved.

A structure and a working process of the sub-pixel P will be schematically illustrated by taking an example in which an external compensation manner (in which the driving transistor is sensed) is adopted and the pixel circuit is of the "3T1C" structure. In addition, in the following description, the pixel circuit 130 is any one of pixel circuits 130 of sub-pixels P that are located in an N-th row, and N is a positive integer.

Figure 6:
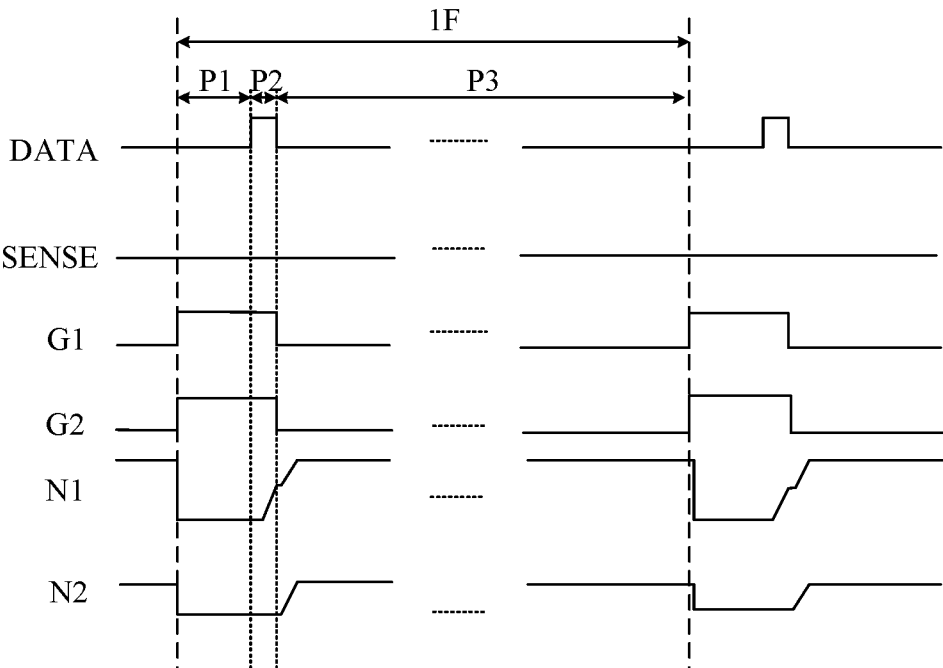
FIG. 6 is a timing diagram of a circuit of the sub-pixel shown in FIG. 5.

In this case, as shown in FIGS. 6 and 7, the scan driving circuit(s) 110 include only a gate driving circuit 111, and the scan signal line(s) 150 include only the gate scan signal line(s) GL. The gate scan signal line GL may transmit the scan signal Gate and the reset signal Reset in different periods. For the specific description, reference may be made below.

As shown in FIG. 5, the pixel circuit 130 of the "3T1C" structure may include: a first transistor T1, a second transistor T2, a third transistor T3 and a storage capacitor Cst.

As shown in FIG. 5, a control electrode of the first transistor T1 is electrically connected to a first scan signal terminal G1, a first electrode of the first transistor T1 is electrically connected to a data signal terminal DATA, and a second electrode of the first transistor T1 is electrically connected to a first node N1. The first transistor T1 is configured to, in response to a first scan signal received at the first scan signal terminal G1, transmit a data signal received at the data signal terminal DATA to the first node N1.

Here, the data signal may include, for example, a detection data signal and a display data signal. The detection data signal is used in a blanking period and the display data signal is used in a display period. For the display period and the blanking period, reference may be made to the description in some embodiments below, which will not be described here.

As shown in FIG. 5, a control electrode of the second transistor T2 is electrically connected to the first node N1, a first electrode of the second transistor T2 is electrically connected to a first voltage signal terminal ELVDD, and a second electrode of the second transistor T2 is electrically connected to a second node N2. The second transistor T2 is configured to transmit a voltage signal received at the first voltage signal terminal ELVDD to the second node N2 under control of a voltage at the first node N1.

As shown in FIG. 5, a first terminal of the storage capacitor Cst is electrically connected to the first node N1, and a second terminal of the storage capacitor Cst is electrically connected to the second node N2. The first transistor T1 charges the storage capacitor Cst while charging the first node N1.

As shown in FIG. 5, an anode of the light-emitting device 140 is electrically connected to the second node N2, and a cathode of the light-emitting device 140 is electrically connected to a second voltage signal terminal ELVSS. The light-emitting device 140 is configured to emit light under a cooperation of the voltage signal at the second node N2 and a voltage signal transmitted from the second voltage signal terminal ELVSS.

As shown in FIG. 5, a control electrode of the third transistor T3 is electrically connected to a second scan signal terminal G2, a first electrode of the third transistor T3 is electrically connected to a sensing signal terminal SENSE, and a second electrode of the third transistor T3 is electrically connected to the second node N2. The third transistor T3 is configured to, in response to a second scan signal received at the second scan signal terminal G2, sense an electrical property of the second transistor T2 to achieve the external compensation. The electrical property may include a threshold voltage of the second transistor T2 and/or a carrier mobility of the second transistor T2.

Here, the sensing signal terminal SENSE may provide a reset signal or acquire a sensing signal. The reset signal is used to reset the second node N2, and the sensing signal is used to obtain the threshold voltage of the second transistor T2.

It will be noted that, in the circuit shown in FIG. 5, the nodes N1 and N2 do not represent actual components, but represent junction points of relevant electrical connections in the circuit diagram. That is, these nodes are equivalent to the junction points of the relevant electrical connections in the circuit diagram.

Based on the structure of the pixel circuit 130 described above, one frame period may include the display period and the blanking period that are performed in sequence. In the display period, the sub-pixel P performs image display. In the blanking period, the sub-pixel P is externally compensated. Only the display period will be schematically described below.

As shown in FIGS. 5 and 6, in the display period, the working process of the sub-pixel P may include, for example, a reset phase P1, a data writing phase P2 and a light-emitting phase P3.

In the reset phase P1, the second scan signal provided by the second scan signal terminal G2 is at a high level, and the sensing signal terminal SENSE provides the reset signal (the reset signal is, for example, at a low level). The third transistor T3 is turned on under control of the second scan signal, and receives the reset signal, and then transmits the reset signal to the second node N2 to reset the second node N2.

In the data writing phase P2, the first scan signal provided by the first scan signal terminal G1 is at a high level, and the display data signal provided by the data signal terminal DATA is at a high level. The first transistor T1 is turned on under control of the first scan signal, and receives the display data signal, and then transmits the display data signal to the first node N1 and charges the storage capacitor Cst at the same time.

In the light-emitting phase P3, the first scan signal provided by the first scan signal terminal G1 is at a low level, the second scan signal provided by the second scan signal terminal G2 is at a low level, and the voltage signal provided by the first voltage signal terminal ELVDD is at a high level.

In this case, the first transistor T1 is turned off under control of the first scan signal, and the third transistor T3 is turned off under control of the second scan signal. The storage capacitor Cst starts to discharge, so that a voltage at the first node N1 remains at a high level. The second transistor T2 is turned on under control of the voltage at the first node N1, and receives the voltage signal from the first voltage signal terminal ELVDD, and then transmits the voltage signal to the second node N2, so that the light-emitting device 140 emits light under the cooperation of the voltage signal at the second node N2 and the voltage signal at the second voltage signal terminal ELVSS.

Based on the structure of the pixel circuit 130 and the timing sequences of the first scan signal and the second scan signal, referring to FIGS. 2 and 5, the pixel circuits 130 of the sub-pixels P in the same row may be electrically connected to a same scan signal line 150; referring to FIGS. 3 and 5, the pixel circuits 130 of the sub-pixels P in the same row may also be electrically connected to two scan signal lines 150.

For example, as shown in FIGS. 5 and 7, the pixel circuits 130 of the sub-pixels P in the same row are connected to two gate scan signal lines GL, and the two gate scan signal lines GL may be a first gate scan signal line GL1 and a second gate scan signal line GL2.

Referring to FIGS. 5 and 7, the first gate scan signal line GL1 is electrically connected to first scan signal terminals G1 in the pixel circuits 130 of the sub-pixels P in the N-th row. That is, the first gate scan signal line GL1 is electrically connected to control electrodes of first transistors T1 in the pixel circuits 130. The first gate scan signal line GL1 is configured to transmit a first scan signal.

Referring to FIGS. 5 and 7, the second gate scan signal line GL2 is electrically connected to second scan signal terminals G2 in the pixel circuits 130 of the sub-pixels P in the N-th row. That is, the second gate scan signal line GL2 is electrically connected to control electrodes of third transistors T3 in the pixel circuits 130. The second gate scan signal line GL2 is configured to transmit a second scan signal.

However, in the related art, in a process of manufacturing a display panel, charges are accumulated on a scan signal line to form static electricity. When the charges are accumulated to a certain extent, an electric discharge, which is referred to an electro static discharge (ESD), is formed. Insulating film layers are broken down in the discharging process, resulting in short circuit between conductive layers in different layers. For example, a gate signal line (a first gate voltage signal line, a second gate voltage signal line, or the like) in a peripheral area and the scan signal line are short-circuited, which causes a horizontal dark line on the display panel. As another example, the scan signal line and a channel region of a transistor are short-circuited, which causes a vertical dark line on the display panel.

It will be noted that, referring to FIG. 4, the channel region of the transistor 131 may be a portion of the active layer 1311 of the transistor 131, and an orthographic projection of the portion of the active layer 1311 on the substrate 10 overlaps with an orthographic projection of the gate 1314 of the transistor 131 on the substrate 10.

Figure 9:
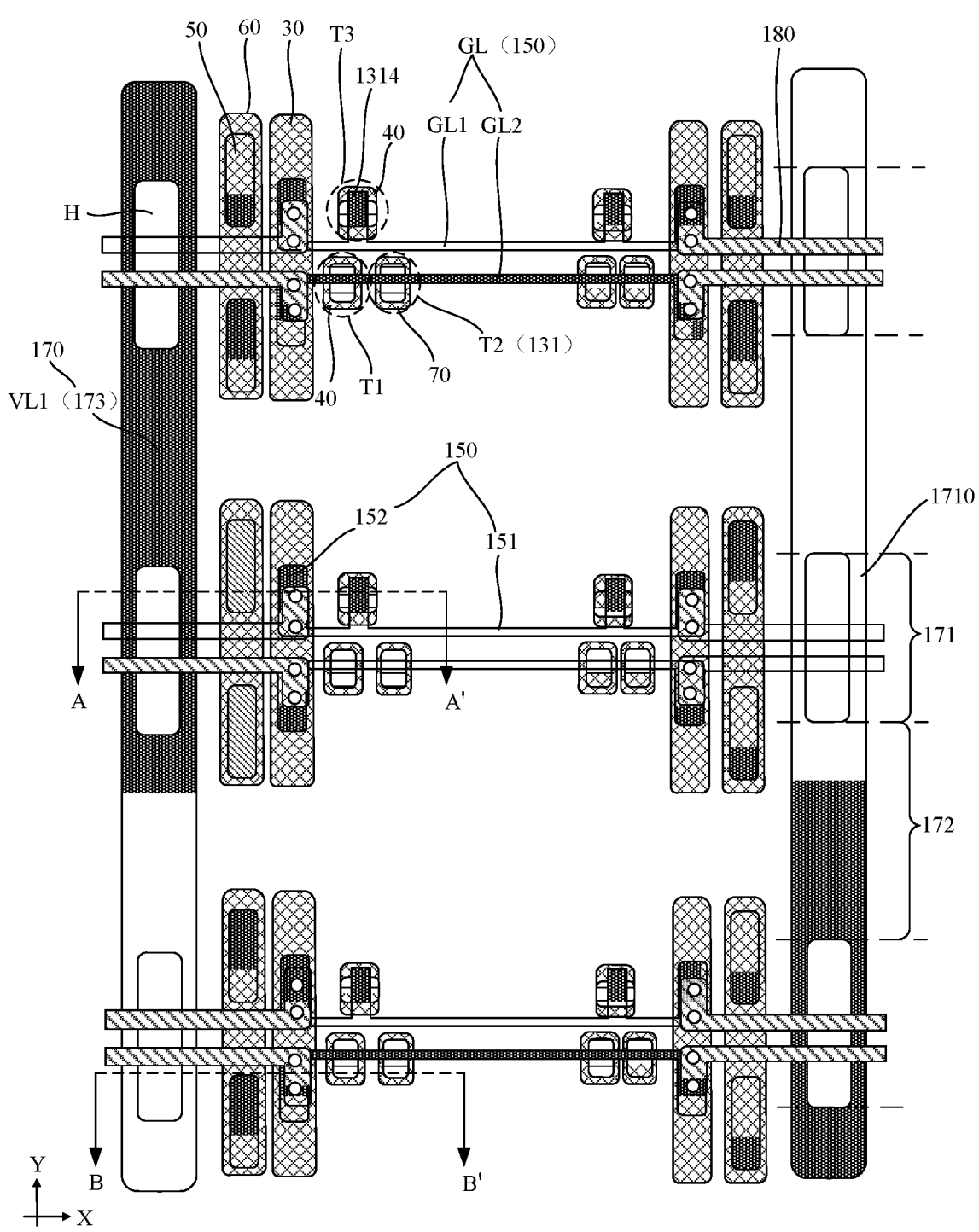
FIG. 9 is a circuit wiring diagram of the display panel shown in FIG. 8.
Figure 10:
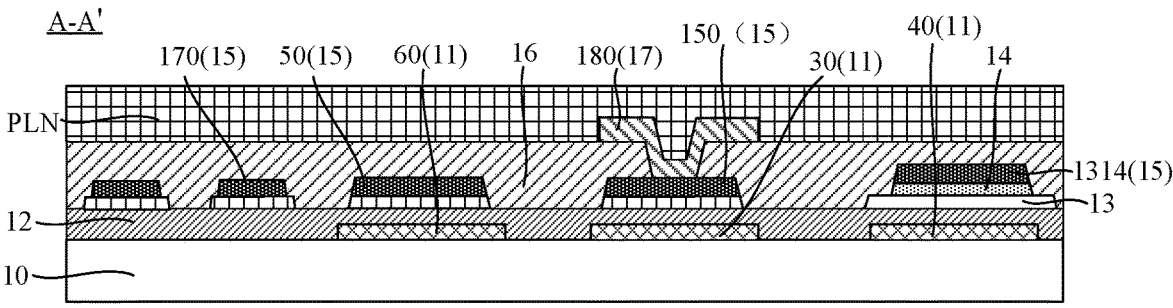
FIG. 10 is a sectional view taken along the line A-A' in FIG. 9.

In light of this, as shown in FIGS. 8, 9 and 10, the display panel 100 provided in some embodiments of the present disclosure further includes at least one first conductive block 30. The first conductive block 30 is located in a different layer from the scan signal line 150 and is electrically insulated from the scan signal line 150.

As shown in FIGS. 8 and 9, the scan signal line 150 includes a wire body 151 and at least one transfer pad 152, and a transfer pad 152 is disposed at an end of the wire body 151. Here, the transfer pad 152 may be configured to be connected to a transfer line 180 located in another layer, so as to be electrically connected to the scan driving circuit 110 through the transfer line 180.

For example, referring to FIGS. 8, 9 and 10, the scan signal line 150 and the gate signal line 170 are disposed in a same layer. The scan signal line substantially extends along the first direction X; the gate signal line 170 substantially extends along the second direction Y. At least one gate signal line 170 is located at a side of the scan driving circuit 110 proximate to the display area A.

In this case, the display panel 100 further includes transfer line(s) 180, an end of a transfer line 180 is electrically connected to the transfer pad 152 of the scan signal line 150, and another end of the transfer line 180 is electrically connected to the scan driving circuit 110, so that the scan signal line 150 is electrically connected to the scan driving circuit 110. The transfer line 180 and the scan signal line 150 are located in different layers, and an orthographic projection of the transfer line 180 on the substrate 10 partially overlaps with an orthographic projection of at least one gate signal line 170 on the substrate 10.

Based on this, as shown in FIG. 9, the wire body 151 substantially extends along the first direction X; in the second direction Y, a dimension of the transfer pad 152 may be greater than a width of the wire body 151, which facilitates a connection between the transfer line 180 and the transfer pad 152.

The number of transfer pads 152 depends on whether a single-sided driving manner or a double-sided driving manner is adopted for the scan signal line 150.

For example, as shown in FIG. 9, in a case where the single-sided driving manner shown in FIG. 7 is adopted for the scan signal line 150, the scan signal line 150 includes the wire body 151 (referring to FIG. 9) and one transfer pad 152 (referring to FIG. 9); the transfer pad 152 (referring to FIG. 9) is disposed at an end of the wire body 151 (referring to FIG. 9) proximate to the scan driving circuit 110 and is electrically connected to the scan driving circuit 110 through the transfer line 180. With such an arrangement, it may be possible to reduce the size of the peripheral area B of the display panel 100 and reduce the manufacturing cost of the display panel 100.

It will be noted that, the single-sided driving manner being adopted for the scan signal line 150 means that, the display panel 100 includes one scan driving circuit 110, and the scan driving circuit 110 is disposed at one side of the display area A in the first direction (an extending direction of the scan signal line 150), and transmits signals to scan signal lines 150 row by row.

For example, referring to FIG. 9, in a case where the double-sided driving manner shown in FIG. 8 is adopted for the scan signal line 150, the scan signal line 150 includes the wire body 151 and two transfer pads 152; the two transfer pads 152 are disposed at two opposite ends of the wire body 151, respectively, and are each electrically connected to a corresponding scan driving circuit 110 through a transfer line 180. With such an arrangement, it may be possible to improve the accuracy of the signal received by the pixel circuits 130 in the same row from the scan signal line 150, and reduce an influence of the voltage drop due to a length of the scan signal line 150.

It will be noted that, the double-sided driving manner being adopted for the scan signal line 150 means that, the display panel 100 includes two scan driving circuits 110, the two scan driving circuits 110 are disposed at two opposite sides of the display area A in the first direction (the extending direction of the scan signal line 150), respectively, and the two scan driving circuits 110 simultaneously transmit signals to the scan signal lines 150 row by row from the two sides.

An orthographic projection of the first conductive block 30 on the substrate 10 at least partially overlaps with an orthographic projection of the transfer pad 152 on the substrate 10.

For example, as shown in FIGS. 9 and 10, the orthographic projection of the transfer pad 152 on the substrate 10 is located in the orthographic projection of the first conductive block 30 on the substrate 10, so that a facing area between the transfer pad 152 and the first conductive block 30 is the largest. As a result, a charge amount that can be stored in a first capacitor formed by the transfer pad 152 and the first conductive block 30 is the largest.

In this case, portions, which are opposite, of the first conductive block 30 and the transfer pad 152 constitute the first capacitor. Since the first capacitor is capable of storing charges, the first capacitor can reduce the risk of electro static discharge at the transfer pad 152 at one end or the transfer pads 152 at both ends of the scan signal line 150 in the extending direction of the scan signal line 150, thereby reducing the risk of short circuit between conductive layers in different layers caused by the electro static discharge at the transfer pad(s) 152. For example, the risk of short circuit between the gate signal line 170 in the peripheral area B and the scan signal line 150 is reduced. As a result, the risk of the horizontal dark line generated on the display panel 100 is reduced.

In addition, referring to FIGS. 8, 9 and 10, the display panel 100 provided in the embodiments of the present disclosure may further include at least one second conductive block 40. A second conductive block 40 is located in a different layer from the gate 1314 of the transistor 131 and is electrically insulated from the gate 1314 of the transistor 131.

An orthographic projection of the second conductive block 40 on the substrate 10 at least partially overlaps with an orthographic projection, on the substrate 10, of a gate 1314 of at least one transistor 131 in the pixel circuit 130.

For example, as shown in FIGS. 9 and 10, an orthographic projection, on the substrate 10, of the gate 1314 of the at least one transistor 131 in the pixel circuit 130 is located within the orthographic projection of the second conductive block 40 on the substrate 10, so that a facing area between the gate 1314 and the second conductive block 40 is the largest. As a result, the charge amount that can be stored by a second capacitor formed by the gate 1314 and the second conductive block 40 is the largest.

In this case, portions, which are opposite, of the second conductive block 40 and the gate 1314 of the transistor 131 constitute the second capacitor. Since the second capacitor is capable of storing charges, the second capacitor can reduce the risk of electro static discharge at the gate 1314 of the transistor 131, thereby reducing the risk of short circuit between conductive layers in different layers caused by the electro static discharge at the gate 1314 of the transistor 131. For example, the risk of short circuit between the gate 1314 of the transistor 131 and the channel region of the transistor 131 is reduced. As a result, the risk of the vertical dark line generated on the display panel 100 is reduced.

It will be noted that, the gate 1314 of the transistor 131 and the scan signal line 150 may be arranged as a whole.

For example, referring to FIGS. 5, 9, and 10, the pixel circuit 130 includes a switching transistor (the first transistor T1 in FIG. 5), and the orthographic projection of the second conductive block 40 on the substrate 10 at least partially overlaps with an orthographic projection of a gate 1314 of the switching transistor on the substrate 10.

For example, as shown in FIGS. 9 and 10, the orthographic projection of the gate 1314 of the switching transistor on the substrate 10 is located in the orthographic projection of the second conductive block 40 on the substrate 10, so that the facing area between the gate 1314 of the switching transistor and the second conductive block 40 is the largest. As a result, the charge amount that can be stored in the second capacitor formed by the gate 1314 of the switching transistor and the second conductive block 40 is the largest, thereby reducing the risk of short circuit between the gate 1314 and the channel region of the switching transistor.

The gate 1314 of the switching transistor and the scan signal line 150 may be arranged as a whole.

For example, as shown in FIGS. 8, 9 and 10, for the pixel circuit 130 of the 3T1C structure, the first transistor T1 is the switching transistor; the scan signal line 150 includes the first gate scan signal line GL1, and the first gate scan signal line GL1 is electrically connected to the first scan signal terminal G1 in the pixel circuit 130. That is, a portion of the first gate scan signal line GL1 located on the active layer 1311 of the first transistor T1 may directly serve as the gate 1314 of the first transistor T1. In this case, the gate 1314 of the first transistor T1 and the first gate scan signal line GL1 is arranged as the whole.

In some embodiments, referring to FIGS. 5, 8 and 9, the pixel circuit 130 is driven in the external compensation manner. That is, the pixel circuit 130 further includes a sensing transistor (the third transistor T3 in FIG. 5), and the orthographic projection of the second conductive block 40 on the substrate 10 at least partially overlaps with an orthographic projection of a gate 1314 of the sensing transistor on the substrate 10.

For example, as shown in FIGS. 9 and 10, the orthographic projection of the gate 1314 of the sensing transistor on the substrate 10 is located in the orthographic projection of the second conductive block 40 on the substrate 10, so that a facing area between the gate 1314 of the sensing transistor and the second conductive block 40 is the largest. As a result, the charge amount that can be stored in the second capacitor formed by the gate 1314 of the sensing transistor and the second conductive block 40 is the largest, thereby reducing the risk of short circuit between the gate 1314 and the channel region of the sensing transistor.

The gate 1314 of the sensing transistor and the scan signal line 150 may be arranged as a whole.

For example, as shown in FIGS. 5, 8 and 9, for the pixel circuit 130 of the 3T1C structure, the third transistor T3 is the sensing transistor; the scan signal line 150 includes the second gate scan signal line GL2, and the second gate scan signal line GL2 is electrically connected to the second scan signal terminal G2 in the pixel circuit 130. That is, a portion of the second gate scan signal line GL2 located on the active layer 1311 of the third transistor T3 may directly serve as the gate 1314 of the third transistor T3. In this case, the gate 1314 of the third transistor T3 and the second gate scan signal line GL2 is arranged as the whole.

In some embodiments, referring to FIGS. 8, 9 and 10, the display panel 100 may further include at least one third conductive block 50 disposed in the same layer as the scan signal line 150. A third conductive block 50 is located between the gate signal line(s) 170 and the scan signal line 150.

For example, as shown in FIGS. 8, 9 and 10, the display panel 100 further includes a plurality of third conductive blocks 50. One third conductive block 50 is disposed between each scan signal line 150 and the gate signal line(s) 170.

In this case, one third conductive block 50 is disposed between the gate signal line(s) 170 and the scan signal line 150, and the third conductive block 50 is not connected to another circuit. That is, the third conductive block 50 is in a floating state. In this way, at least two times of electro static discharge are needed for the short circuit between the scan signal line 150 (or the transfer line 180) and the gate signal line 170, so that the risk of the short circuit between the gate signal line 170 and the scan signal line 150 may be reduced.

It will be noted that, a first time of electro static discharge may be that an electro static discharge happens at the transfer pad 152 of the scan signal line 150, which causes the scan signal line 150 (or the transfer line 180) to be electrically connected to the third conductive block 50; a second time of electro static discharge may be that an electro static discharge happens at the third conductive block 50, which causes the third conductive block 50 and the gate signal line 170 to be short-circuited. As a result, the scan signal line 150 (or the transfer line 180) and the gate signal line 170 are short-circuited.

In some embodiments, referring to FIGS. 9 and 10, the orthographic projection of the transfer line 180 on the substrate 10 and the orthographic projection of the third conductive block 50 on the substrate 10 are staggered, so as to reduce the risk of short circuit between the transfer line 180 and the third conductive block 50.

In addition, referring to FIGS. 8, 9 and 10, the display panel 100 may further include at least one fourth conductive block 60, and the fourth conductive block 60 and the third conductive block 50 are located in different layers and are electrically insulated from each other. An orthographic projection of a fourth conductive block 60 on the substrate 10 partially overlaps with an orthographic projection of at least one third conductive block 50 on the substrate 10.

For example, as shown in FIGS. 9 and 10, the orthographic projection of the third conductive block 50 on the substrate 10 is located in the orthographic projection of the fourth conductive block 60 on the substrate 10, so that a facing area between the third conductive block 50 and the fourth conductive block 60 is the largest. As a result, the charge amount that can be stored in a third capacitor formed by the third conductive block 50 and the fourth conductive block 60 is the largest.

In this case, portions, which are opposite, of the third conductive block 50 and the fourth conductive block 60 constitute the third capacitor. Since the third capacitor is capable of storing charges, the third capacitor can reduce the risk of electro static discharge at the third conductive block 50. That is, the risk of the second time of electro static discharge is reduced. As a result, the risk of short circuit between the scan signal line 150 and the gate signal line 170 reduced.

It will be noted that, referring to FIG. 10, the first conductive block 30, the second conductive block 40 and the fourth conductive block 60 are made of a same material and disposed in a same layer. The film layer where the first conductive block 30, the second conductive block 40 and the fourth conductive block 60 are specifically located may refer to the following, and is not described in the embodiments of the present disclosure.

In addition, as shown in FIGS. 8 and 9, in the case where the double-sided driving manner is adopted, two scan driving circuits 110 are disposed at two opposite sides of the display area A in the first direction X, respectively. First conductive blocks 30 are symmetrically arranged with respect to a central line L of the display area A in the second direction Y; second conductive blocks 40 are symmetrically arranged with respect to the central line L of the display area A in the second direction Y; third conductive blocks 50 are symmetrically arranged with respect to a central line L of the display area A in the second direction Y; and fourth conductive blocks 60 are symmetrically arranged with respect to the central line L of the display area A in the second direction Y.

It will be understood that, based on the structure of the pixel circuit 130, referring to FIGS. 2, 3 and 5, the pixel circuits 130 of the sub-pixels P in the same row may be electrically connected to one scan signal line 150, or may be electrically connected to multiple scan signal lines 150.

For example, referring to FIGS. 3, 8, and 9, pixel circuits 130 in each row are electrically connected to multiple scan signal lines 150. The multiple scan signal lines 150 electrically connected to the pixel circuits 130 in the same row constitute a group of scan signal lines 150, and third conductive blocks 50 located between the group of scan signal lines 150 and the gate signal line 170 constitute a group of third conductive blocks 50.

For example, as shown in FIGS. 8 and 9, for the pixel circuit 130 of the 3T1C structure, the pixel circuits 130 of the sub-pixels P in the same row are electrically connected to two scan signal lines 150. That is, the group of scan signal lines 150 include two scan signal lines 150, and the group of third conductive blocks 50 include two third conductive blocks 50.

As shown in FIGS. 9 and 10, orthographic projections of the group of third conductive blocks 50 on the substrate 10 each at least partially overlap with an orthographic projection of a same fourth conductive block 60 on the substrate 10. With such an arrangement, the group of third conductive blocks 50 may share one fourth conductive block 60, which is easy to be fabricated and has a low cost.

In addition, as shown in FIGS. 9 and 10, orthographic projections, on the substrate 10, of transfer pads 152 in the group of scan signal lines 150 each at least partially overlap with an orthographic projection of a same first conductive block 30 on the substrate 10. With such an arrangement, the transfer pads 152 in the group of scan signal lines 150 may share one first conductive block 30, which is easy to be fabricated and has a low cost.

In some embodiments, referring to FIGS. 8, 9 and 10, in gate signal lines 170 that partially overlap with the orthographic projection of the transfer line 180 on the substrate 10, at least one gate signal line 170 is provided with at least one hollowed-out region H therein. An orthographic projection of each hollow-out region H on the substrate 10 partially overlaps with an orthographic projection of at least one transfer line 180 on the substrate 10. In addition, in the second direction Y, a length of the hollow-out region H is greater than a width of the transfer line 180. The hollow-out region H may be substantially in a long strip shape.

That is, as shown in FIGS. 9 and 10, in the gate signal lines 170 that partially overlap with the orthographic projection of the transfer line 180 on the substrate 10, at least one gate signal line 170 includes first wire segments 171 and second wire segments 172 that are alternately connected. The first wire segment 171 is disposed at a side of a row of pixel circuits 130 in the first direction X. The first wire segment 171 includes a plurality of wire sub-segments 1710 arranged in parallel, and two ends of each wire sub-segment 1710 are connected to two adjacent second wire segments 172, respectively. Orthographic projections, on the substrate 10, of the plurality of wire sub-segments 1710 of the first wire segment 171 each partially overlap with the orthographic projection of the at least one transfer line 180 on the substrate 10.

For example, referring to FIGS. 8 and 9, a gate signal line 170 that is at a side of the display area A in the first direction X and closest to the display area A is a set gate signal line 173; an orthographic projection of the set gate signal line 173 on the substrate 10 partially overlaps with the orthographic projection of the transfer line 180 on the substrate 10 (referring to FIG. 10), and the set gate signal line 173 is provided with hollow-out region(s) H therein. That is, the set gate signal line 173 includes first wire segments 171 and second wire segments 172 that are alternately connected.

For example, as shown in FIGS. 7, 8 and 9, the at least one gate signal line 170 includes a gate initialization signal line SL, at least one clock signal line CL, the first gate voltage signal line VL1 and the second gate voltage signal line VL2. FIGS. 7, 8, and 9 each illustrate two clock signal lines CL as an example.

Here, the first gate voltage signal line VL1, the second gate voltage signal line VL2, the at least one clock signal line CL and the gate initialization signal line SL are sequentially arranged in a direction directed from the display area A to the peripheral area B. In this case, the set gate signal line 173 is the first gate voltage signal line VL1.

In this case, after the transfer line 180 and one of the plurality of wire sub-segments 1710 are short-circuited, the problem of short circuit between the transfer line 180 and the gate signal line 170 may be solved by cutting the short-circuited wire sub-segment 1710, which is beneficial to maintenance.

Referring to FIGS. 8 and 9, transfer lines 180 electrically connected to the group of scan signal lines 150 constitute a group of transfer lines 180. Orthographic projections of the group of transfer lines 180 on the substrate 10 each partially overlap with an orthographic projection of a same hollow-out region H on the substrate 10. That is, the orthographic projections of the group of transfer lines 180 on the substrate 10 each partially overlap with an orthographic projection of a same first wire segment 171 on the substrate 10.

For example, as shown in FIGS. 8 and 9, for the pixel circuit 130 of the 3T1C structure, the pixel circuits 130 of the sub-pixels P in the same row are electrically connected to two scan signal lines 150. That is, the group of scan signal lines 150 include two scan signal lines 150, and the group of transfer lines 180 include two transfer lines 180.

In this case, orthographic projections, on the substrate 10 (referring to FIG. 10), of two transfer lines 180 in the group of transfer lines 180 each partially overlap with the orthographic projection of the same hollow-out region H on the substrate 10 (referring to FIG. 10). That is, the orthographic projections, on the substrate 10, of the two transfer lines 180 in the group of transfer lines 180 each partially overlap with the orthographic projection of the same first wire segment 171 on the substrate 10 (referring to FIG. 10). With such an arrangement, the group of transfer lines 180 may share one first wire segment 171 for maintenance, which is easy to be fabricated and has a low cost.

In some embodiments, referring to FIGS. 8, 9, and 10, the display panel 100 includes a light-shielding layer 11, a first insulating layer 12, a semiconductor layer 13, a gate insulating layer 14, a gate conductive layer 15, an interlayer insulating layer 16 and a source-drain conductive layer 17 that are sequentially arranged in a thickness direction of the substrate 10 and away from the substrate 10.

Here, the active layer of the transistor in the pixel circuit 130 may be located in the semiconductor layer 13; the gate of the transistor in the pixel circuit 130, the scan signal line 150, the third conductive block 50 and the gate signal line 170 may be located in the gate conductive layer 15; and the first conductive block 30, the second conductive block 40 and the fourth conductive block 60 may be located in the light-shielding layer 11.

It will be noted that, a material of the semiconductor layer 13 includes a metal oxide semiconductor material, such as indium gallium zinc oxide. In this way, a high charge mobility, stability and scalability may be achieved at a low production cost.

Figure 11:
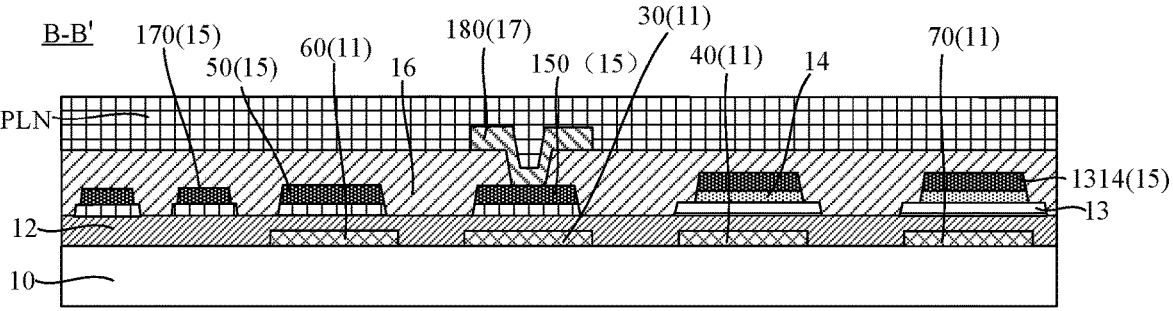
FIG. 11 is a sectional view taken along the line B-B' in FIG. 9.

Based on this, referring to FIGS. 9 and 11, the light-shielding layer 11 may further include at least one light-shielding block 70. An orthographic projection of a light-shielding block 70 on the substrate 10 at least partially overlaps with an orthographic projection, on the substrate 10, of the channel region of the driving transistor (the second transistor T2 in FIG. 5) in the pixel circuit 130, so as to shield the channel region of the driving transistor (the second transistor T2 in FIG. 5) and prevent light from directly irradiating the channel region of the driving transistor (the second transistor T2 in FIG. 5), thereby avoiding the threshold voltage of the driving transistor from drifting.

It will be noted that, as shown in FIGS. 4, 10, and 11, the display panel 100 may further include a buffer layer BF, a passivation layer PVX, a planarization layer PLN, a pixel defining layer PDL and an encapsulation layer 20.

The buffer layer BF is disposed between the light-shielding layer 11 and the substrate 10, the passivation layer PVX is disposed on a side of the source-drain conductive layer 17 away from the substrate 10, the planarization layer PLN is disposed on a side of the passivation layer PVX away from the substrate 10, the pixel defining layer PDL is disposed on a side of the planarization layer PLN away from the substrate 10, and the encapsulation layer 20 is disposed on a side of the pixel defining layer PDL away from the substrate 10.

It will be noted that, the pixel defining layer PDL is provided with a plurality of openings therein, and the opening defines a light-emitting region of the light-emitting device. The encapsulation layer 20 is used for encapsulating the pixel circuits 130 and the light-emitting devices 140. The encapsulation layer 20 may be an encapsulation film or an encapsulation substrate, which is not specifically limited in the embodiment of the present disclosure.

Some embodiments of the present disclosure provide a repairing method for a display panel, and the display panel 100 includes scan signal line(s) 150, a scan driving circuit 110, gate signal line(s) 170 and transfer line(s) 180. A gate signal line 170 is electrically connected to the scan driving circuit 110, an end of a transfer line 180 is electrically connected to a scan signal line 150, and another end of the transfer line 180 is electrically connected to the scan driving circuit 110.

The scan signal line 150 and the gate signal line 170 are disposed in a same layer, and the transfer line 180 and the scan signal line 150 are located in different layers; an orthographic projection of the transfer line 180 on the substrate 10 partially overlaps with an orthographic projection of the gate signal line 170 on the substrate 10.

Here, the gate signal line 170 includes first wire segments 171 and second wire segments 172 that are alternately connected, the first wire segment 171 is disposed at a side of a row of pixel circuits 130 in the first direction X. The first wire segment 171 includes a plurality of wire sub-segments 1710 arranged in parallel, and two ends of each wire sub-segment 1710 are connected to two adjacent second wire sub-segment 172, respectively; orthographic projections, on the substrate 10, of the plurality of wire sub-segments 1710 of the first wire segment 171 each partially overlap with the orthographic projection of the transfer line 180 on the substrate 10.

Figure 12:
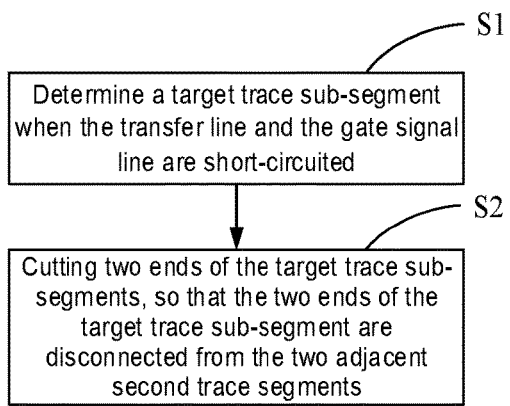
FIG. 12 is a flow diagram of a repairing method for a display panel, in accordance with some embodiments.

Based on the structure of the display panel 100, referring to FIG. 12, the repairing method includes steps S1 to S2.

In S1, when the transfer line 180 and the gate signal line 170 are short-circuited, a target wire sub-segment is determined.

In the step, the target wire sub-segment is a wire sub-segment 1710 that is short-circuited with the transfer line 180 in the plurality of wire sub-segments 1710 of the first wire segment 171 in the gate signal line 170.

In S2, two ends of the target wire sub-segment is cut, so that the two ends of the target wire sub-segment are disconnected from the two adjacent second wire segments 172.

The foregoing descriptions are merely specific implementation manners of the present disclosure, but the protection scope of the present disclosure is not limited thereto, any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel having a display area and a peripheral area disposed at at least one side of the display area, the display panel comprising:

a substrate;

a plurality of sub-pixels;

at least one scan signal line disposed on the substrate, wherein a scan signal line in the at least one scan signal line is coupled to a row of sub-pixels in the plurality of sub-pixels; the scan signal line in the at least one scan signal line includes a wire body and at least one transfer pad, and a transfer pad in the at least one transfer pad is disposed at an end of the wire body; and at least one first conductive block located in the peripheral area, wherein a first conductive block in the at least one first conductive block is located in a different layer from the scan signal line and electrically insulated from the scan signal line; an orthographic projection of the first conductive block on the substrate at least partially overlaps with an orthographic projection of the transfer pad on the substrate.

2. The display panel according to claim 1, wherein the wire body extends along a first direction, and in a second direction, a dimension of the transfer pad is greater than a width of the wire body; the second direction is substantially perpendicular to the first direction.

3. The display panel according to claim 1, wherein each of the plurality of sub-pixels includes a pixel circuit disposed on the substrate, wherein the pixel circuit includes a plurality of transistors, and each transistor includes a gate; and the display panel further comprises at least one second conductive block, wherein a second conductive block in the at least one second conductive block is located in a different layer from the gate of the transistor and electrically insulated from the gate of the transistor; an orthographic projection of the second conductive block on the substrate at least partially overlaps with an orthographic projection, on the substrate, of a gate of at least one transistor in the pixel circuit.

4. The display panel according to claim 3, wherein a switching transistor is included in the plurality of transistors, and the orthographic projection of the second conductive block on the substrate at least partially overlaps with an orthographic projection of a gate of the switching transistor on the substrate; and/or a sensing transistor is included in the plurality of transistors, and the orthographic projection of the second conductive block on the substrate at least partially overlaps with an orthographic projection of a gate of the sensing transistor on the substrate.

5. The display panel according to claim 3, wherein the gate of the at least one transistor and the scan signal line are arranged as a whole.

6. The display panel according to claim 1, wherein the display panel further comprises:

a scan driving circuit that is disposed on the substrate and located in the peripheral area;

at least one gate signal line that is disposed in a same layer as the scan signal line and located in the peripheral area, wherein the at least one gate signal line extends along a second direction and is electrically connected to the scan driving circuit, and the second direction is substantially perpendicular to an extending direction of the scan signal line; and at least one third conductive block, wherein a third conductive block in the at least one third conductive block is disposed in the same layer as the scan signal line and located between the at least one gate signal line and the scan signal line.

7. The display panel according to claim 6, further comprising:

at least one fourth conductive block that is located in a different layer from the at least one third conductive block and electrically insulated from the at least one third conductive block, wherein an orthographic projection of a fourth conductive block in the at least one fourth conductive block on the substrate at least partially overlaps with an orthographic projection of the third conductive block on the substrate.

8. The display panel according to claim 7, wherein the at least one scan signal line includes a plurality of scan signal lines, and the at least one third conductive block includes a plurality of third conductive blocks; one third conductive block in the plurality of third conductive block is disposed between each of the plurality of scan signal lines and the at least one gate signal line;

the plurality of sub-pixels further include a plurality of pixel circuits that are arranged in a plurality of rows and a plurality of columns, and pixel circuits in each row are electrically connected to scan signal lines in the plurality of scan signal lines;

scan signal lines, electrically connected to pixel circuits in a same row, in the plurality of scan signal lines constitute a group of scan signal lines, and third conductive blocks, located between the group of scan signal lines and the at least one gate signal line, in the plurality of third conductive blocks constitute a group of third conductive blocks; and orthographic projections of the group of third conductive blocks on the substrate each at least partially overlap with an orthographic projection of a same fourth conductive block in the at least one fourth conductive block on the substrate.

9. The display panel according to claim 7, wherein the display panel further comprises a pixel circuit and at least one second conductive block, the pixel circuit includes a plurality of transistors, and each transistor includes a gate; a second conductive block in the at least one second conductive block is located in a different layer from the gate of the transistor and electrically insulated from the gate of the transistor; an orthographic projection of the second conductive block on the substrate at least partially overlaps with an orthographic projection, on the substrate, of a gate of at least one transistor in the pixel circuit; and the first conductive block, the second conductive block and the fourth conductive block are made of a same material and are disposed in a same layer.

10. The display panel according to claim 9, wherein the display panel comprises: a light-shielding layer, a first insulating layer, a semiconductor layer, a gate insulating layer, a gate conductive layer, an interlayer insulating layer and a source-drain conductive layer that are sequentially arranged in a thickness direction of the substrate and away from the substrate;

the first conductive block, the second conductive block and the fourth conductive block are located in the light-shielding layer.

11. The display panel according to claim 10, wherein a driving transistor is included in the plurality of transistors; and the light-shielding layer further includes: at least one light-shielding block, wherein an orthographic projection of a light-shielding block in the at least one light-shielding block on the substrate at least partially overlaps with an orthographic projection of a channel region of the driving transistor on the substrate; and/or the at least one scan signal line, the at least one third conductive block and the at least one gate signal line are located in the gate conductive layer.

12. The display panel according to claim 9, wherein there are two scan driving circuits;

the two scan driving circuits are disposed at two opposite sides of the display area in a first direction, respectively; the at least one first conductive block includes first conductive blocks, the at least one second conductive block includes second conductive blocks, the at least one third conductive block includes third conductive blocks, and the at least one fourth conductive block includes fourth conductive blocks; the first conductive blocks are symmetrically arranged with respect to a center line of the display area in a second direction; the second conductive blocks are symmetrically arranged with respect to the center line of the display area in the second direction; the third conductive blocks are symmetrically arranged with respect to the center line of the display area in the second direction; the fourth conductive blocks are symmetrically arranged with respect to the center line of the display area in the second direction; and the second direction is substantially perpendicular to the first direction.

13. The display panel according to claim 6, further comprising:

one or more transfer lines, wherein an end of a transfer line is electrically connected to the transfer pad of the scan signal line, and another end of the transfer line is electrically connected to the scan driving circuit; the transfer line and the scan signal line are located in different layers, and an orthographic projection of the transfer line on the substrate partially overlaps with an orthographic projection of one or more gate signal lines in the at least one gate signal line on the substrate;

in the one or more gate signal lines that partially overlap with the orthographic projection the transfer line on the substrate, a gate signal line is provided with at least one hollow-out region therein, an orthographic projection of each hollow-out region on the substrate partially overlaps with an orthographic projection of at least one transfer line in the one or more transfer lines on the substrate; and in the second direction, a length of the hollow-out region is greater than a width of the transfer line.

14. The display panel according to claim 13, wherein a gate signal line that is at a side of the display area in the first direction and closest to the display area is a set gate signal line; an orthographic projection of the set gate signal line on the substrate partially overlaps with the orthographic projection of the transfer line on the substrate, and the at least one hollowed-out region is disposed in the set gate signal line; or the gate signal line that is at the side of the display area in the first direction and closest to the display area is the set gate signal line; the orthographic projection of the set gate signal line on the substrate partially overlaps with the orthographic projection of the transfer line on the substrate, and the at least one hollowed-out region is disposed in the set gate signal line; and the at least one gate signal line includes a gate initialization signal line, at least one clock signal line, a first gate voltage signal line and a second gate voltage signal line, wherein the first gate voltage signal line, the second gate voltage signal line, the at least one clock signal line and the gate initialization signal line are sequentially arranged in a direction directed from the display area to the peripheral area, and the set gate signal line is the first gate voltage signal line.

15. The display panel according to claim 13, wherein the at least one scan signal line includes a plurality of scan signal lines, and the one or more transfer lines includes a plurality of transfer lines;

the plurality of sub-pixels further include a plurality of pixel circuits that are arranged in a plurality of rows and a plurality of columns, and pixel circuits in each row are electrically connected to scan signal lines in the plurality of scan signal lines;

scan signal lines, electrically connected to pixel circuits in a same row, in the plurality of scan signal lines constitute a group of scan signal lines, and transfer lines, electrically connected to the group of scan signal lines, in the plurality of transfer lines constitute a group of transfer lines; orthographic projections of the group of transfer lines on the substrate each partially overlap with an orthographic projection of a same hollow-out region on the substrate.

16. The display panel according to claim 13, wherein the hollow-out region is substantially in a long strip shape; and/or the orthographic projection of the transfer line on the substrate and an orthographic projection of the third conductive block on the substrate are staggered.

17. The display panel according to claim 13, wherein the at least one scan signal line includes a plurality of scan signal lines, and the one or more transfer lines includes a plurality of transfer lines;

the plurality of sub-pixels further include a plurality of pixel circuits that are arranged in a plurality of rows and a plurality of columns, and pixel circuits in each row are electrically connected to at least one scan signal line in the plurality of scan signal lines;

in the one or more gate signal lines that partially overlap with the orthographic projection of the transfer line on the substrate, at least one gate signal line includes first wire segments and second wire segments that are alternately connected; a first wire segment in the first wire segments is disposed at a side of a row of pixel circuits in the first direction; the first wire segment includes a plurality of wire sub-segments arranged in parallel, and two ends of each wire sub-segment are connected to two adjacent second wire segments in the second wire segments, respectively; and orthographic projections, on the substrate, of the plurality of wire sub-segments of the first wire segment each partially overlap with the orthographic projection of at least one transfer line in the plurality of transfer lines on the substrate.

18. The display panel according to claim 1, wherein the at least one scan signal line includes a plurality of scan signal lines;

the plurality of sub-pixels further include a plurality of pixel circuits that are arranged in a plurality of rows and a plurality of columns, and pixel circuits in each row are electrically connected to scan signal lines in the plurality of scan signal lines;

scan signal lines, electrically connected to pixel circuits in a same row, in the plurality of scan signal lines constitute a group of scan signal lines, and orthographic projections, on the substrate, of transfer pads in the group of scan signal lines each at least partially overlap with an orthographic projection of a same first conductive block on the substrate.

19. A display apparatus, comprising the display panel according to claim 1.

20. A repairing method for a display panel, wherein the display panel has a display area and a peripheral area disposed at at least one side of the display area; the display panel includes: at least one scan signal line, a scan driving circuit, at least one gate signal line and at least one transfer line, a gate signal line in the at least one gate signal line is electrically connected to the scan driving circuit, an end of a transfer line in the at least one transfer line is electrically connected to a scan signal line in the at least one scan signal line, and another end of the transfer line is electrically connected to the scan driving circuit; the at least one gate signal line is located in the peripheral area;

the scan signal line and the gate signal line are disposed in a same layer, the transfer line and the scan signal line are located in different layers; an orthographic projection of the transfer line on a substrate partially overlaps with an orthographic projection of the gate signal line on the substrate; the gate signal line includes first wire segments and second wire segments that are alternately connected; a first wire segment in the first wire segments is disposed at a side of a row of pixel circuits in a first direction; the first wire segment includes a plurality of wire sub-segments arranged in parallel, and two ends of each wire sub-segment are connected to two adjacent second wire segments in the second wire segments, respectively; orthographic projections, on the substrate, of the plurality of wire sub-segments of the first wire segment each partially overlap with the orthographic projection of the transfer line on the substrate;

the repairing method comprises:

determining a target wire sub-segment when the transfer line and the gate signal line are short-circuited; the target wire sub-segment being a wire sub-segment that is short-circuited with the transfer line in the plurality of wire sub-segments of the first wire segment in the gate signal line; and cutting two ends of the target wire sub-segments, so that the two ends of the target wire sub-segment are disconnected from the two adjacent second wire segments.

*  *  *  *  *